(12) United States Patent  (10) Patent No.: US 8,144,523 B2
Kobatake  (45) Date of Patent: Mar. 27, 2012

(54) SEMICONDUCTOR STORAGE DEVICE

(75) Inventor: Hiroyuki Kobatake, Kanagawa (JP)

(73) Assignee: Renesas Electronics Coporation, Kanagawa (JP)

( * ) Notice: Subject to any disclaimer, the term of this patent is extended or adjusted under 35 U.S.C. 154(b) by 192 days.

(21) Appl. No.: 12/725,775

(22) Filed: Mar. 17, 2010

(65) Prior Publication Data

US 2010/0246243 A1 Sep. 30, 2010

(30) Foreign Application Priority Data

Mar. 25, 2009 (JP) .................................. 2009-074560

(51) Int. Cl.
*G11C 7/10* (2006.01)
(52) U.S. Cl. ............... 365/189.05; 365/194; 365/189.15
(58) Field of Classification Search ............. 365/189.05, 365/194, 189.15
See application file for complete search history.

(56) References Cited

U.S. PATENT DOCUMENTS

| 7,440,325 | B2* | 10/2008 | Shibata ..................... 365/185.17 |
| 7,643,372 | B2 | 1/2010 | Yamagami | |
| 2008/0205184 | A1 | 8/2008 | Tsukude | |
| 2008/0253172 | A1 | 10/2008 | Yamagami | |

FOREIGN PATENT DOCUMENTS

| JP | 4-205890 | 7/1992 |
| JP | 2008-176907 | 7/2008 |
| JP | 2008-210443 | 9/2008 |
| JP | 2008-262637 | 10/2008 |

* cited by examiner

*Primary Examiner* — Son Dinh
*Assistant Examiner* — Nam Nguyen
(74) *Attorney, Agent, or Firm* — Young & Thompson

(57) ABSTRACT

A semiconductor storage device in accordance with an exemplary aspect of the present invention includes a plurality of memory cells arranged in a matrix pattern, a plurality of word lines each provided so as to correspond to each line of the memory cells, a plurality of bit lines each connected to respective one of the memory cells, and a row selection circuit that, in a read operation, drives the word line to a set potential at a drive speed slower than a discharge speed of the bit line exhibited when the word line is raised roughly vertically to VDD.

8 Claims, 16 Drawing Sheets

SEMICONDUCTOR STORAGE DEVICE

INCORPORATION BY REFERENCE

This application is based upon and claims the benefit of priority from Japanese patent application No. 2009-074560, filed on Mar. 25, 2009, the disclosure of which is incorporated herein in its entirety by reference.

BACKGROUND

1. Field of the Invention

The present invention relates to a semiconductor storage device, in particular a semiconductor storage device including a flip-flop type memory cell.

2. Description of Related Art

FIG. 21 shows a configuration of a SRAM (Static Random Access Memory) disclosed in Japanese Unexamined Patent Application Publication No. 2008-262637 (Yamagami), and FIG. 22 shows a configuration of a memory cell used in this SRAM. The reading operation of this SRAM is explained with reference to FIG. 23. FIG. 23 is a diagram for explaining a problem of the SRAM disclosed in Yamagami.

When a selected word line WL1 changes to a High level and access transistors 18 and 19 are thereby turned on, a potential at a cell node (connection point between a load transistor 11 and a drive transistor 16) that has retained Low data by bit lines BL1 and /BL1 pre-charged to the power-supply potential VDD is pulled down to Vnd.

If Vnd is larger than the logic threshold voltage Vth1 of the load transistor 11 and the drive transistor 16 that constitutes the cell inverter, the corruption of stored data could occur due to the inversion of the cell inverter, and thus leading to the malfunction of the SRAM (SNM (Static Noise Margin) failure).

Therefore, in Yamagami, pull-down circuits 30A and 30B that set the High level of the selected word line WL to a potential lower than the power-supply potential VDD are provided. In this way, the potential rise of the cell node retaining Low data is suppressed so that Vnd becomes smaller than the logic threshold voltage Vth1 of the cell inverter, and therefore an improvement is made against the occurrence of the stored data corruption (SNM failure).

Japanese Unexamined Patent Application Publication Nos. 2008-210443 and 2008-176907 also disclose similar techniques to make an improvement against the SNM failure by setting the High level of word lines to a potential lower than the power-supply potential. However, in these SNM improving techniques, although the reading characteristic is improved by setting the High level of selected word lines WL to a potential lower than VDD, the writing characteristic to the cells becomes worse on the contrary.

Writing is performed by driving a bit line BL1 to a Low level by a writing circuit so that the cell node that has been kept at a High level by the load transistor 11 is pulled down to a Low level through the access transistor 18 of the cell. However, since the potential of the selected word line WL1 has been lowered, the on-resistance of the access transistor 18 increases, and thus making pulling down the cell node to the Low level very difficult. Consequently, the data writing characteristic to the cell deteriorates.

Accordingly, it is conceivable that the High level of the selected word line WL1 should be set to the power-supply potential VDD only during the writing operation. However, when the word line WL1 is selected but the bit lines BL2 and /BL2 are not selected, it creates such a situation that cell access is performed for a memory cell 10C connected to the bit lines BL2 and /BL2 but stored data is not output (hereinafter called "pseudo-read state"). Therefore, the potential of the cell node at which a Low level is stored rises, and thus leading to the occurrence of the stored data corruption.

Further, Japanese Unexamined Patent Application Publication No. 4-205890 discloses a semiconductor storage device in which the driving capability of word line drivers during writing operation is reduced and delayed by a read/write signal (R/W signal) in order to eliminate the necessity of the write recovery time (address delay) that would be otherwise necessary when the semiconductor storage device changes from the write mode to the read mode.

SUMMARY

The present inventors have found a following problem. That is, although the SNM improving techniques in related art can improve the reading characteristic, they have a problem that the writing characteristic becomes worse and they cannot, therefore, achieve both an excellent SRAM reading characteristic and writing characteristic simultaneously.

A first exemplary aspect of the present invention is a semiconductor storage device including: a plurality of word lines provided to correspond to the respective rows of the memory cells; a plurality of bit lines connected to a plurality of memory cells in respective columns of the memory cells; and a row selection circuit that, in a read operation, drives the word line to a set potential at a drive speed slower than a discharge speed of the bit line exhibited when the word line is raised roughly vertically to the set potential.

In this way, by adding a delay to the rising speed of the selected word line WL, an amount of data change retained in a memory cell can be suppressed, and therefor an improvement can be made against the SNM failure without deteriorating the writing characteristic.

The present invention, in an exemplary aspect, can provide a semiconductor storage device capable of achieving both an excellent reading operation and writing operation.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 1 shows a configuration of a semiconductor storage device in accordance with a first exemplary embodiment of the present invention;

FIG. 2 shows a configuration of a memory cell of a semiconductor storage device in accordance with a first exemplary embodiment of the present invention;

FIG. 3 is a timing chart for explaining an operation of a semiconductor storage device in accordance with a first exemplary embodiment of the present invention;

FIG. 4 is a diagram for explaining an operation of a semiconductor storage device in accordance with a first exemplary embodiment of the present invention;

FIG. 5A is a diagram for explaining an operation of a semiconductor storage device in accordance with a first exemplary embodiment of the present invention;

FIG. 5B is a diagram for explaining an operation of a semiconductor storage device in accordance with a first exemplary embodiment of the present invention;

FIG. 6 shows a result of a simulation of an amount of potential change Vnd at a cell node NDB in a case where a delay is added to the rising of a selected word line WL;

DETAILED DESCRIPTION OF THE EXEMPLARY EMBODIMENTS

First Exemplary Embodiment

Figure 1:
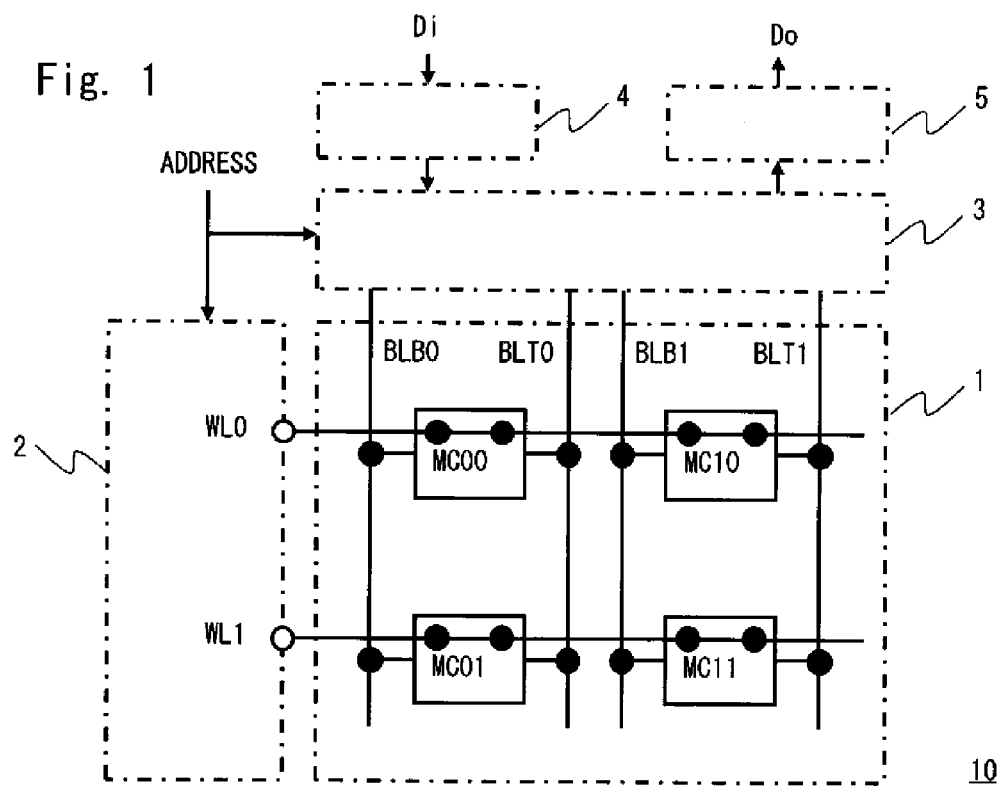

A configuration of a semiconductor storage device in accordance with a first exemplary embodiment of the present invention is explained hereinafter with reference to FIG. 1. FIG. 1 shows a configuration of a semiconductor storage device 10 in accordance with this exemplary embodiment. As shown in FIG. 1, the semiconductor storage device 10 includes a memory cell array 1, a row selection circuit 2, a column selection circuit 3, a writing circuit 4, and a reading circuit 5.

The memory cell array 1 includes word lines WL0 and WL1, bit lines (Bar bit lines: BLB0 and BLB1, and True bit lines: BLT0 and BLT1), and memory cells MC00, MC01, MC10 and MC11. For simplifying the explanation, an example in which two memory cells are connected to each of two pairs of bit lines (BLB0 and BLT0, and BLB1 and BLT1) is explained hereinafter.

The word lines WL0 and WL1 extend in the horizontal direction in FIG. 1, and arranged in parallel with each other. Further, the bit lines BLB0, BLB1, BLT0 and BLT1 extend in the vertical direction in FIG. 1, and arranged in parallel with each other. The word lines WL0 and WL1, and bit lines BLB0, BLB1, BLT0 and BLT1 are arranged so as to cross each other.

The memory cells MC00 and MC01 are connected to the bit lines BLB0 and BLT0. The memory cells MC10 and MC11 are connected to the bit lines BLB1 and BLT1. The memory cells MC00 and MC01 are connected to the word line WL0. The memory cells MC01 and MC11 are connected to the word line WL1.

The row selection circuit 2 selects one of the word lines WL0 and WL1 according to an externally-input address. The row selection circuit 2 drives the word line WL with a delay time that is longer than the delay time of the bit line BL exhibited when the word line WL is vertically raised. An operation and a configuration of the row selection circuit 2 are explained later in detail. The column selection circuit 3 selects one of the bit-line pairs (BLB0 and BLT0, or BLB1 and BLT1) according to an externally-input address.

The writing circuit 4 writes data according to a write signal Di into one of the memory cells MC00, MC01, MC10 and MC11. The reading circuit 5 outputs data stored in the memory cells MC00, MC01, MC10 or MC11 as a read signal Do.

Figure 2:
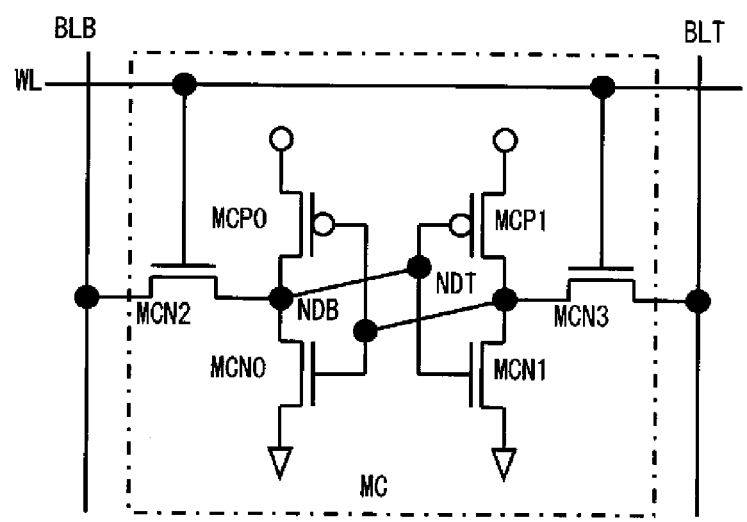

A configuration of each memory cell MC is explained hereinafter with reference to FIG. 2. FIG. 2 shows a configuration of each memory cell MC. As shown in FIG. 2, the memory cell includes load transistors MCP0 and MCP1 each composed of a PMOS, drive transistors MCN0 and MCN1 each composed of an NMOS, and access transistors MCN2 and MCN3 each composed of an NMOS.

The load transistor MCP0 and the drive transistor MCN0 constitute an inverter, and the load transistor MCP1 and the drive transistor MCN1 constitute another inverter.

The gate of the load transistor MCP0 is connected to the gate of the drive transistor MCN0. The drain of the load transistor MCP0 is connected to the source of the drive transistor MCN0. The connection point between the load transistor MCP0 and the drive transistor MCN0 is defined as a node NDB.

The gate of the load transistor MCP1 is connected to the gate of the drive transistor MCN1. The drain of the load transistor MCP1 is connected to the source of the drive transistor MCN1. The connection point between the load transistor MCP1 and the drive transistor MCN1 is defined as a node NDT.

The node NDB is connected to the gates of the load transistor MCP1 and drive transistor MCN1. The node NDT is connected to the gates of the load transistor MCP0 and drive transistor MCN0. In this way, a flip-flop is formed. This flip-flop retains data.

The source of the access transistors MCN2 is connected to the Bar bit line BLB and the drain is connected to the node NDB. Further, the gate of the access transistors MCN2 is connected to the word line WL. The source of the access transistors MCN3 is connected to the True bit line BLT and the drain is connected to the node NDT. Further, the gate of the access transistors MCN3 is connected to the word line WL.

Figure 3:
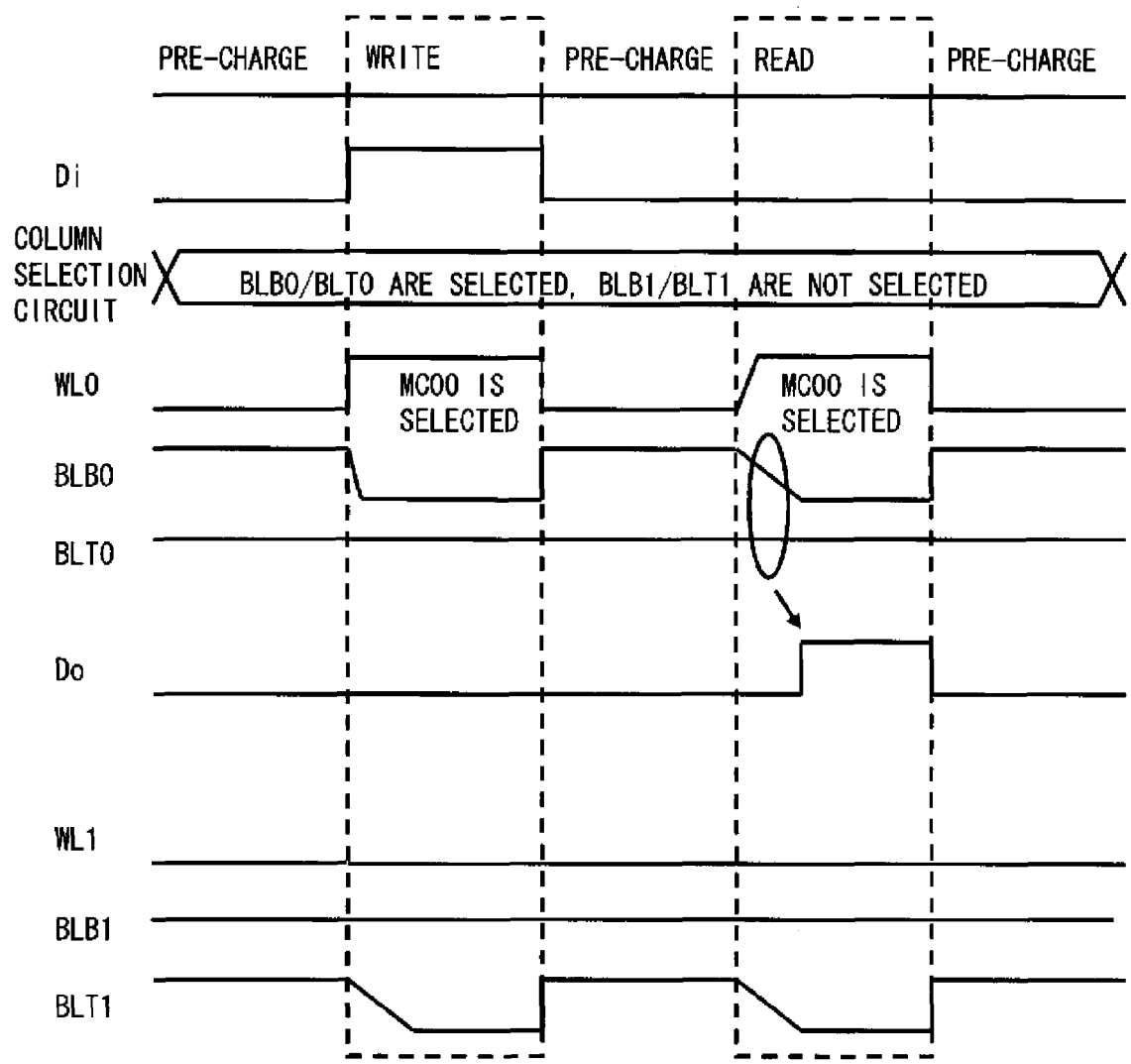

Next, an operation of the semiconductor storage device 10 is explained hereinafter with reference to FIG. 3. FIG. 3 is a timing chart for explaining an operation of the semiconductor storage device 10.

(1) Pre-Charge Period

Firstly, all the bit-line pairs (BLB0 and BLT0, and BLB1 and BLT1) are pre-charged to the power-supply potential VDD, and one of the bit-line pairs is selected by the column selection circuit 3 according to an address. In this example, assume that the bit-line pair (BLB0 and BLT0) is selected, and that the bit-line pair (BLB1 and BLT1) is not selected.

(2) Write Period

After the pre-charge, a write signal Di is applied and the word line WL0 is thereby brought to a High level. Therefore, memory cells MC00 and MC10 are selected. In this way, the memory cell MC00 is connected to the bit-line pair (BLB0 and BLT0), and the memory cell MC10 is connected to the bit-line pair (BLB1 and BLT1).

The writing circuit 4 discharges the bit line BLB0 to a Low level according to the write signal Di (which is "1" in this case), and maintains the bit line BLT0 in the pre-charged state. As a result, data "1" is written into the memory cell MC00.

Note that since the non-selected bit-line pair (BLB1 and BLT1) is in the pre-charged state, the bit line BLT 1 is discharged to a Low level and bit line BLB1 is maintained at the VDD level in the pre-charged state according to the data stored in the memory cell MC10 (which is "0" in this case). That is, the memory cell MC10 is brought into the pseudo-read state, in which although the cell-access is carried out, the stored data is not output.

Further, since the non-selected word line WL1 is at the Low level, the non-selected memory cells MC01 and MC11 are disconnected from the bit-line pairs (BLB0 and BLT0, and BLB1 and BLT1) Therefore, the non-selected memory cells MC01 and MC11 are not brought into a pseudo-read state, and needless to say, no data is written into those non-selected memory cells.

(3) Pre-Charge Period

After that, in the next pre-charge period, all the bit-line pairs (BLB0 and BLT0, and BLB1 and BLT1) are pre-charged to the power-supply potential VDD again.

(4) Read Period

Then, one of the word lines WL is selected by the row selection circuit 2. In this example, the word line WL0 becomes a High level; the memory cells MC00 and MC10 are selected; the memory cell MC00 is connected to the bit-line pair (BLB0 and BLT0); and the memory cell MC10 is connected to the bit-line pair (BLB1 and BLT1).

Since data "1" is stored in the memory cell MC00, which is connected to the bit-line pair (BLB0 and BLT0) selected by the column selection circuit 3, the bit line BLB1 is discharged to a Low level and the bit line BLT0 is maintained at the VDD level in the pre-charged state. Then, Do="1" is output from the reading circuit 5.

In this exemplary embodiment of the present invention, the row selection circuit 2 drives, in the read operation, a word line to the set potential at a drive speed slower than the discharge speed of the bit line exhibited when the word line is raised roughly vertically to the set potential.

Note that since it is at the VDD level in the pre-charged state, the bit line BLT 1 is discharged to a Low level and bit line BLB1 is maintained at the VDD level in the pre-charged state according to the data stored in the memory cell MC10 (which is "0" in this case). That is, the memory cell MC10 is brought into the pseudo-read state.

Further, since the non-selected word line WL1 is at the Low level, the non-selected memory cells MC01 and MC11 are disconnected from the bit-line pairs (BLB0 and BLT0, and BLB1 and BLT1). Therefore, the non-selected memory cells MC01 and MC11 are not brought into a pseudo-read state, and needless to say, no data is written into those non-selected memory cells.

(5) Pre-Charge Period

After that, all the bit-line pairs (BLB0 and BLT0, and BLB1 and BLT1) are pre-charged to VDD again. In the manner described above, data writing to and data reading from the SRAM are performed.

Figure 4:
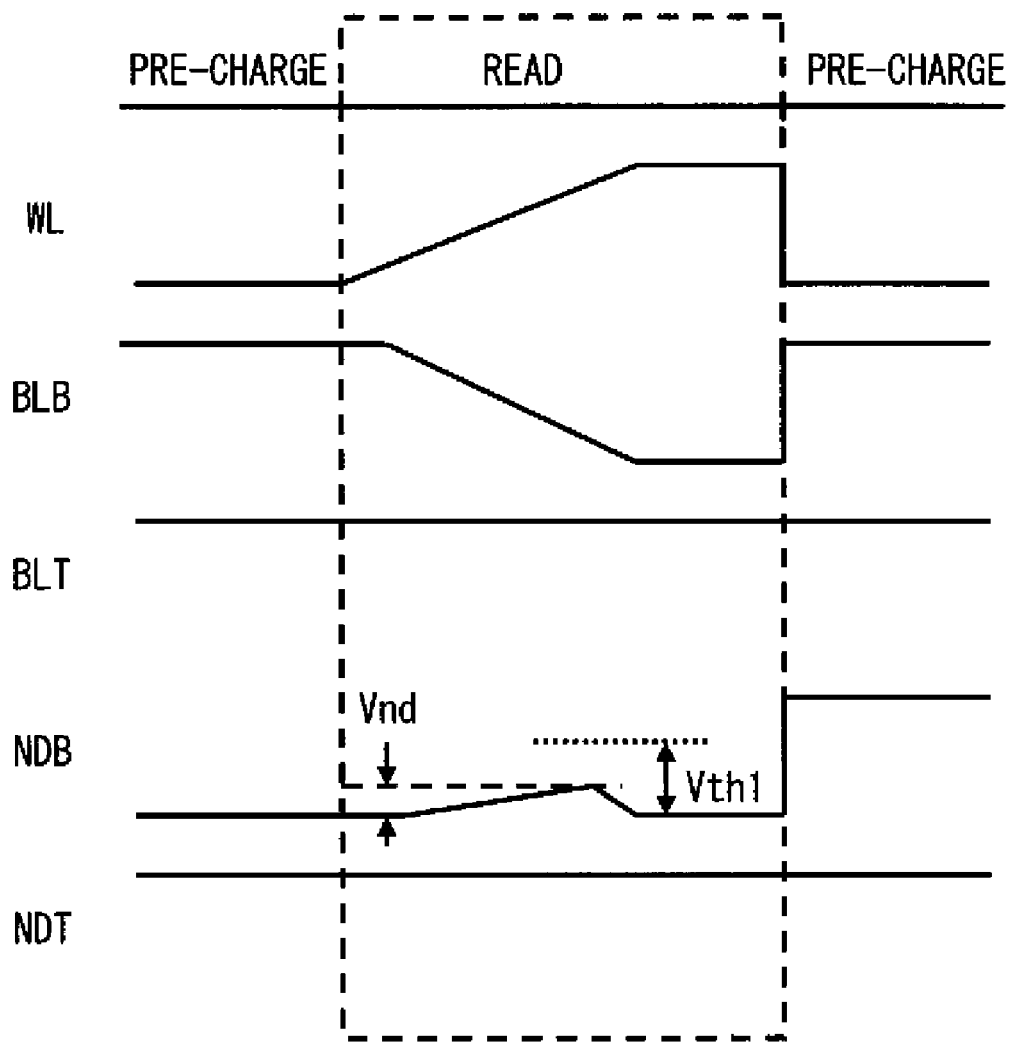

Driving of a selected word line WL is explained hereinafter with reference to FIG. 4. FIG. 4 is a diagram for explaining an operation of the semiconductor storage device 10 during a read operation.

In the semiconductor storage device 10 shown in FIG. 2, when a world line WL at a Low level in a non-selected state is selected and changed to a High level, the access transistors MCN2 and MCN3 are turned on and the cell nodes NDB and NDT are electrically connected to the bit lines BLB and BLT, respectively, which have been pre-charged to VDD. In this way, the potential at the node NDB that has retained a Low level rises.

Each of the access transistors MCN2 and MCN3 is composed of an NMOS. Letting VWL and Vta stand for the word line voltage and the threshold voltage of the access transistors MCN2 respectively, a high voltage equal to or higher than VWL-Vta is never applied to the cell node NDB retaining a Low level. As shown in FIG. 4, by adding a delay to the rising speed of the selected word line WL, the potential rising speed of the cell node NDB is delayed.

In this way, the amount of potential change (Vnd) at the cell node NDB becomes a smaller value (lower voltage) in comparison to the case where the rise of the selected word line WL is not delayed. Therefore, it becomes possible to make Vnd smaller than the logic threshold voltage Vth1 of the cell inverters (MCP1 and MCN1), and thereby to prevent the corruption of stored data (SNM failure) due to the inversion of the cell inverters.

Figure 5A:
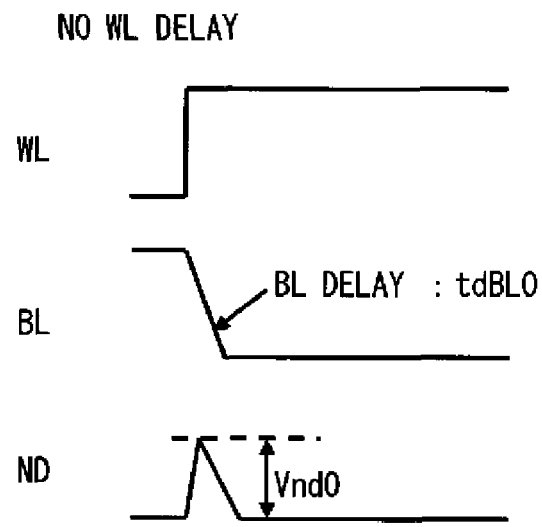
Figure 5B:
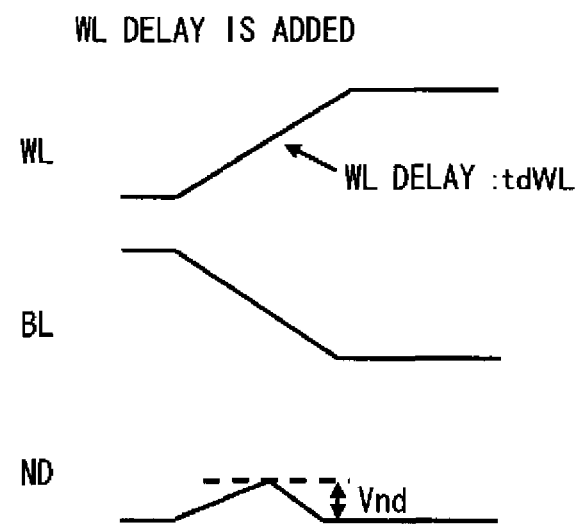

FIG. 5A shows potential changes of the bit line BL and the node ND retaining the data of the memory cell MC in a case where the rising speed of the word line WL involves no delay and the word line WL is thereby raised roughly vertically. FIG. 5B shows potential changes of the bit line BL and the node ND in the case where a delay is added to the rising speed of the word line WL.

As shown in FIG. 5A, the delay time in the discharging of the bit line BL in the case where the word line WL is raised roughly vertically is represented by tdBL0. Further, the amount of potential change at the node ND retaining the data of the memory cell in this case is represented by Vnd0. As shown in FIG. 5B, the rising delay time of the word line WL in the case where a delay is added to the rising of the word line is represented by tdWL. Further, the amount of potential change at the node ND retaining the data of the memory cell in this case is represented by Vnd.

Figure 6:
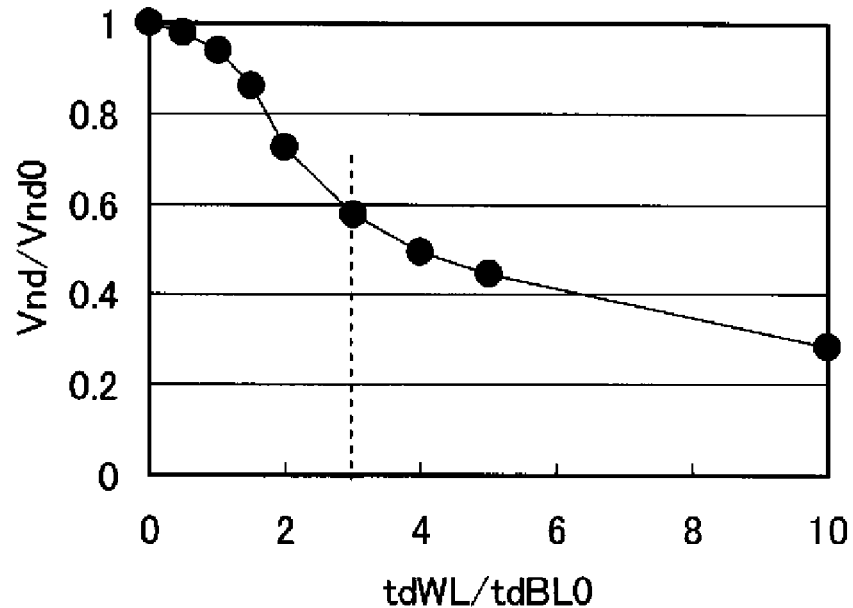

FIG. 6 shows a result of a simulation of the amount of potential change Vnd at the cell node NDB in the case where a delay is added to the rising of the selected word line WL. In FIG. 6, the horizontal axis represents rising delays (tdWL) of the word line WL normalized by the discharge delay (tdBL0) of the bit line BL. Further, the vertical axis represents amounts of potential change Vnd at the cell node normalized by the cell node Vnd0 in the case where the delay in the word line WL is not introduced.

As shown in FIG. 6, the amount of potential change at the cell node (Vnd/Vnd0) decreases as the delay in the rising of the word line WL (tdW1/tdBL0) increases. From this, it is obvious that the operation margin increases. In this manner, by adding a delay to the rising speed of the selected word line WL, the SNM can be improved (increased SNM).

Note that it is preferable to add a delay that is at least three times the discharging delay of the bit line BL to the rising of the selected word line WL as shown in FIG. 6. In this way, a large SNM is achieved, and therefore it is very effective to make an improvement against the SNM failure.

Figure 7:
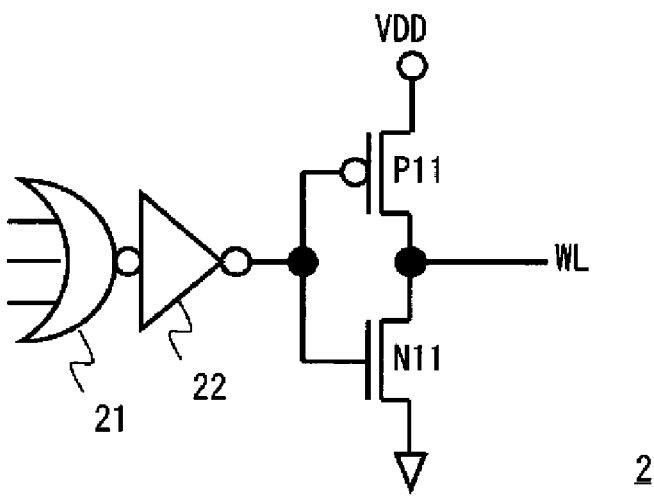
FIG. 7 shows a configuration example of a row selection circuit of a semiconductor storage device in accordance with a first exemplary embodiment of the present invention.
Figure 8:
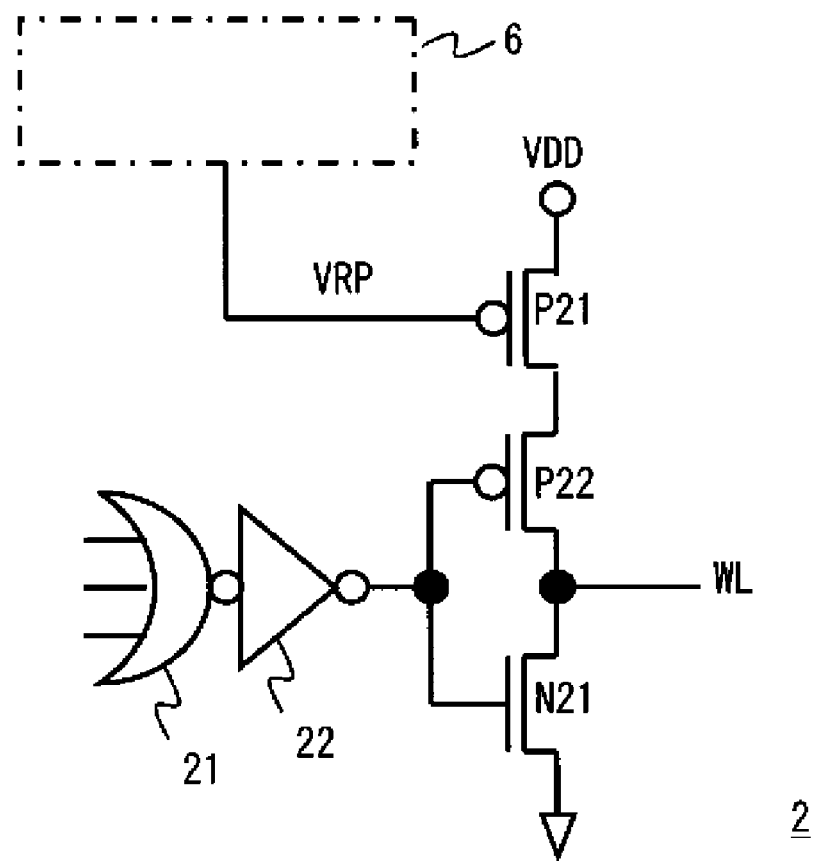
FIG. 8 shows another configuration example of a row selection circuit of a semiconductor storage device in accordance with a first exemplary embodiment of the present invention.

FIGS. 7 and 8 show configuration examples of a row selection circuit 2 used in the semiconductor storage device 10 in accordance with this exemplary embodiment. The circuit shown in FIG. 7 includes a row selection circuit 2, an NOR circuit 21, an inverter 22, a PMOS (P11), an NMOS (N11). The NOR circuit 21 decodes an input address. The signal output from the NOR circuit 21 is input to the inverter 22.

The signal output from the inverter 22 is input to the PMOS (P11) and the NMOS (N11). A power-supply potential VDD is supplied to the source of the PMOS (P11). The drain of the PMOS (P11) is connected to the source of the NMOS (N11). A word line WL is connected to the connection point between the PMOS (P11) and the NMOS (N11).

The PMOS (P11) is designed such that its driving capability becomes lower than that of the NMOS (N11). That is, the width W of the PMOS (P11) is narrower than the width that would be designed so that the driving capabilities of the PMOS (P11) and the NMOS (N11) are roughly equal to each other. In this way, the rising speed of the selected word line WL can be controlled.

The row selection circuit 2 shown in FIG. 8 includes a row selection circuit 2, an NOR circuit 21, an inverter 22, PMOSs (P21 and P22), an NMOS (N21). The signal output from the inverter 22 is input to the PMOS (P22) and the NMOS (N21). The drain of the PMOS (P22) is connected to the source of the NMOS (N11). A word line WL is connected to the connection point between the PMOS (P11) and the NMOS (N11).

The source of the PMOS (P22) is connected to the drain of the PMOS (P21). A power-supply potential VDD is supplied to the source of the PMOS (P21). The gate of the PMOS (P21) is connected to a VRP voltage generation circuit 6. The VRP voltage generation circuit 6 generates a gate potential VRP of the PMOS (P21). By setting the gate potential VRP, which is generated by the VRP voltage generation circuit 6, to an arbitrary intermediate potential, the rising speed of the selected word line WL can be set.

Second Exemplary Embodiment

Figure 9:
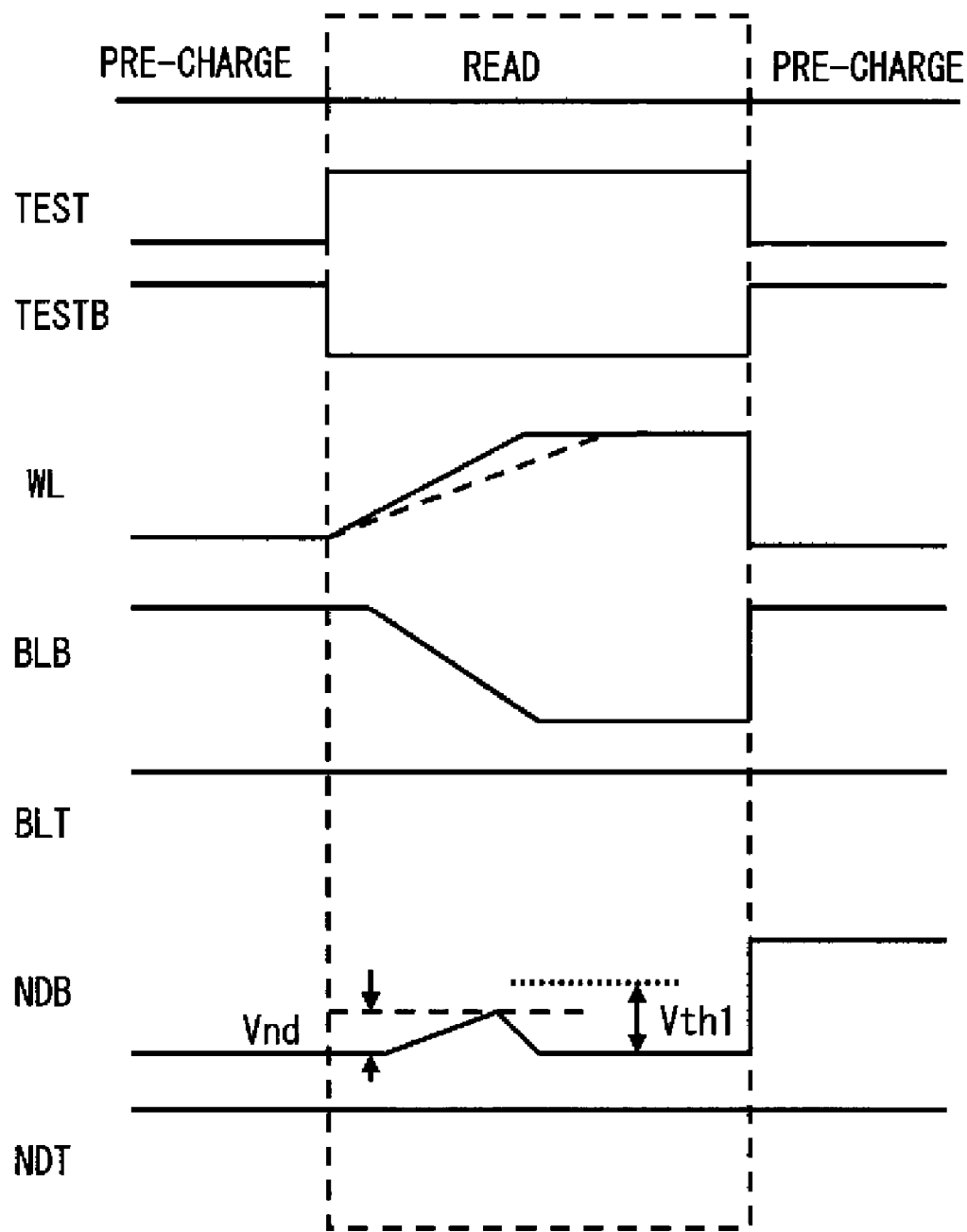
FIG. 9 is a timing chart for explaining an operation of a semiconductor storage device in accordance with a second exemplary embodiment of the present invention.
Figure 10:
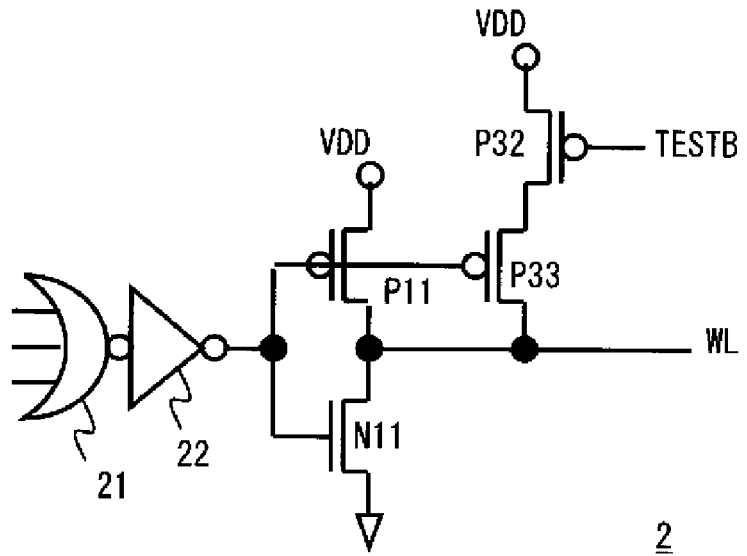
FIG. 10 shows a configuration example of a row selection circuit of a semiconductor storage device in accordance with a second exemplary embodiment of the present invention.
Figure 11:
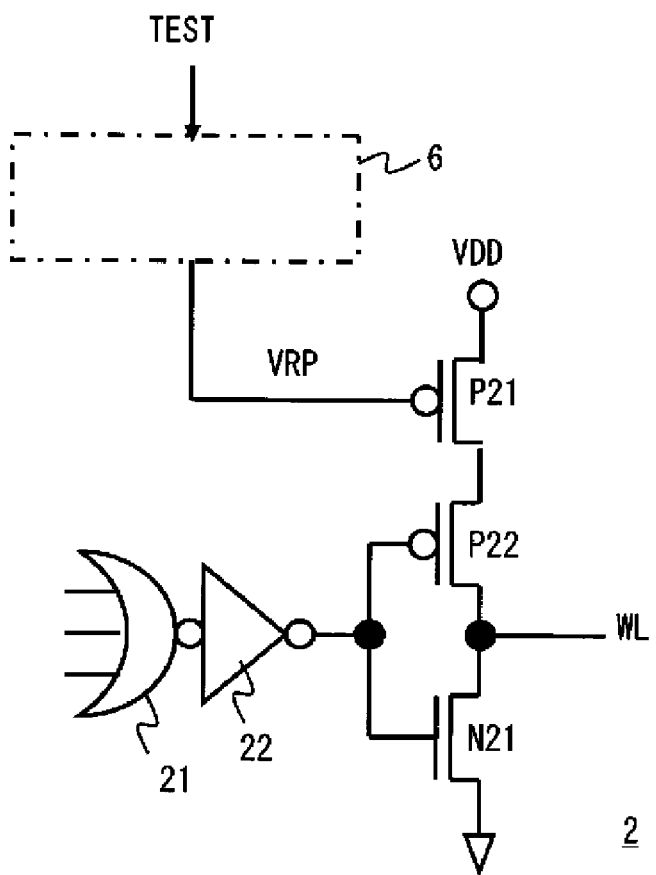
FIG. 11 shows another configuration example of a row selection circuit of a semiconductor storage device in accordance with a second exemplary embodiment of the present invention.

Another exemplary embodiment will be described hereinafter. An operation of a semiconductor storage device in accordance with a second exemplary embodiment of the present invention is explained hereinafter with reference to FIG. 9. FIG. 9 is a timing chart for explaining an operation of a semiconductor storage device in accordance with this exemplary embodiment. In the semiconductor storage device in accordance with this exemplary embodiment, a test to increase the operation margin in the normal operating state is carried out. Note that in FIG. 9, test signals TESTB and TEST input to the row selection circuit 2, which are described later with reference FIGS. 10 and 11, are collectively represented.

Further, in this exemplary embodiment, the word line WL is driven while adding a delay to the rising speed of the word line WL so that the SNM failure can be avoided as in the case of the first exemplary embodiment. Carrying out a normal reading/writing operation is defined as a normal operation.

In this exemplary embodiment, the delay of the rising speed of the selected word line WL during a test (period in which the test signal TEST: High, and the test signal TESTB: Low) is smaller than that of the normal operating state (during a normal reading/writing operation). In FIG. 9, the rising of the selected word line WL during the normal operation is represented by a broken line, and the rising of the selected word line WL during a test is represented by a solid line.

As can be seen from FIG. 9, in a test in which the rising speed of the selected word line WL during the test is set to a small value, the amount of potential change Vnd at the cell node NDB becomes larger to the high-voltage side in comparison to the normal operating state. Therefore, during the test, the semiconductor storage device can be operated in a state where the operation margin of the memory cell MC (logic threshold voltage: Vth1-Vnd of the cell inverters (MCP1 and MCN1)) is smaller than that of the normal operating state.

For a semiconductor storage device which operates properly in this test, i.e., for which Vnd is smaller than the logic threshold voltage: Vth1 of the cell inverters (MCP1 and MCN1), proper operations with a margin is ensured. Note that the margin that can be ensured by this test is a shift amount (shift voltage) of Vnd in the test state.

By constructing the row selection circuit 2 from, for example, a circuit shown in FIG. 10 or 11, the delay of the rising speed of the selected word line WL during a test can be set to a smaller value than that of the normal operating state. FIGS. 10 and 11 show configuration examples of the row selection circuit 2 used in a semiconductor storage device in accordance with this exemplary embodiment.

The circuit shown in FIG. 10 is formed by adding PMOSs (P32 and P33) to the circuit shown in FIG. 7. The gate of the PMOS (P33) is connected to the output of the inverter 22. The drain of the PMOS (P33) is connected to the word line WL, and the source is connected to the drain of the PMOS (P32). A power-supply potential is supplied to the source of the PMOS (P32), and a test signal TESTB is input to the gate of the PMOS (P32).

During the normal operation, the PMOSs (P32 and P33), which are connected in series, and the PMOS 11 simultaneously drive the word line WL. During the test, the test signal TESTB becomes a Low level, and therefore the PMOS (P32 and P33) do not operate. In this way, the delay of the rising speed of the selected word line WL can be set to a smaller value than that of the normal operating state.

Further, the circuit shown in FIG. 11 has a similar structure to that of the circuit shown in FIG. 8. A test signal TEST is input to the VRP voltage generation circuit 6. During a test (period in which the input test signal TEST is at a High level), the gate voltage VRP is set to a lower voltage than that of the normal operating state. As a result, it is possible to set the driving capability of the PMOS (P21) during a test to a larger quantity than that of the normal operating state, and thereby to set the delay of the rising speed of the selected word line WL to a smaller value than that of the normal operating state.

As described above, in accordance with this exemplary embodiment of the present invention, it is possible to ensure proper operations with a margin during the normal operation (normal reading/writing operation), and thereby to provide a semiconductor storage device with higher quality.

Third Exemplary Embodiment

Figure 12:
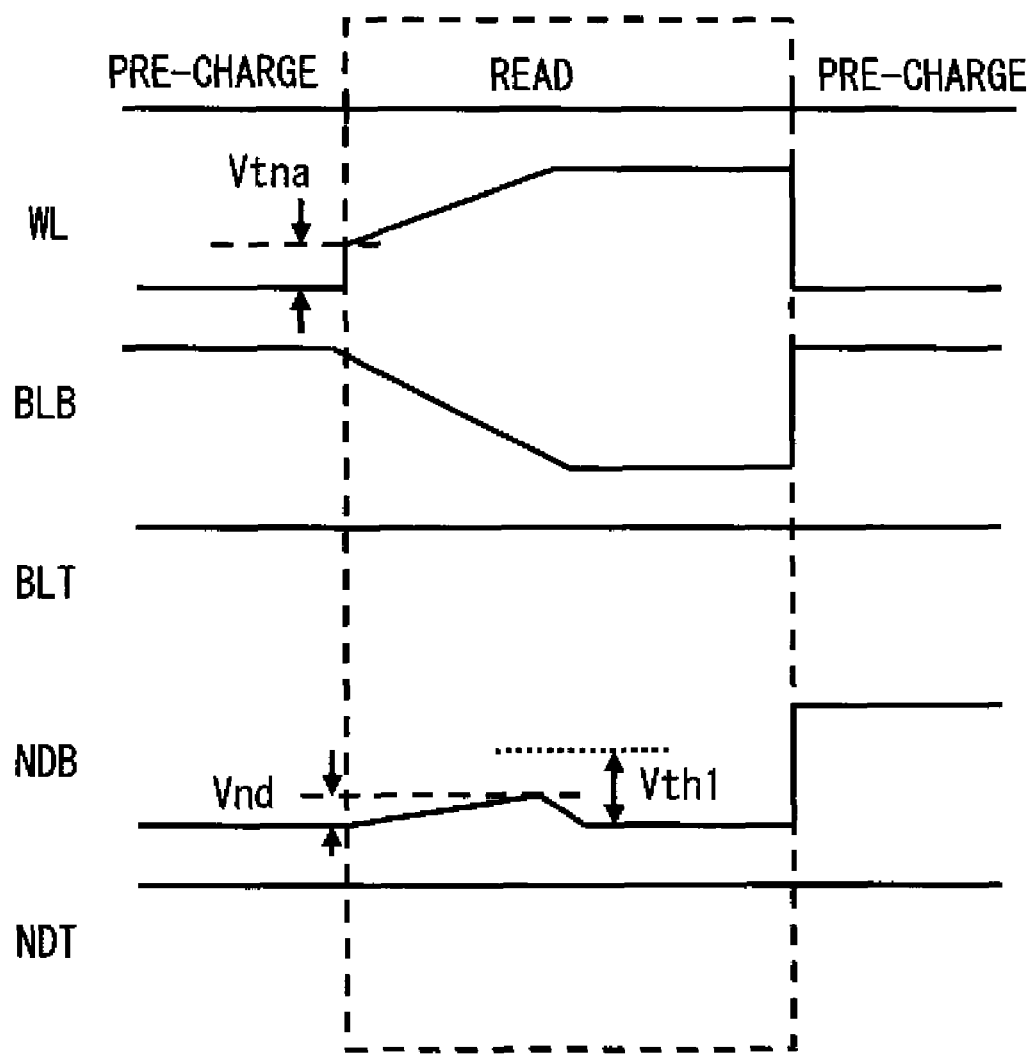
FIG. 12 is a timing chart for explaining an operation of a semiconductor storage device in accordance with a third exemplary embodiment of the present invention.

Another exemplary embodiment will be described hereinafter. An operation of a semiconductor storage device in accordance with a third exemplary embodiment of the present invention is explained hereinafter with reference to FIG. 12. FIG. 12 is a timing chart for explaining an operation of a semiconductor storage device in accordance with this exemplary embodiment. In this exemplary embodiment, as shown in FIG. 12, the selected word line WL is first raised sharply and roughly vertically to the threshold voltage: Vtna of the access transistor, and then the selected word line WL is driven with a delay added to its rising speed.

The access transistors MCN2 and MCN3 of the memory cell MC shown in FIG. 3 is not turned on until the word line voltage reaches the threshold voltage: Vtna of the access transistor, and therefore the malfunction that would otherwise occur when the Low level at the cell node is pulled up is prevented. In accordance with this exemplary embodiment, the delay time until the selected word line WL reaches to Vtna can be reduced without compromising the SNM improvement effect, and thus enabling the operating speed of the SRAM to become higher.

Figure 13:
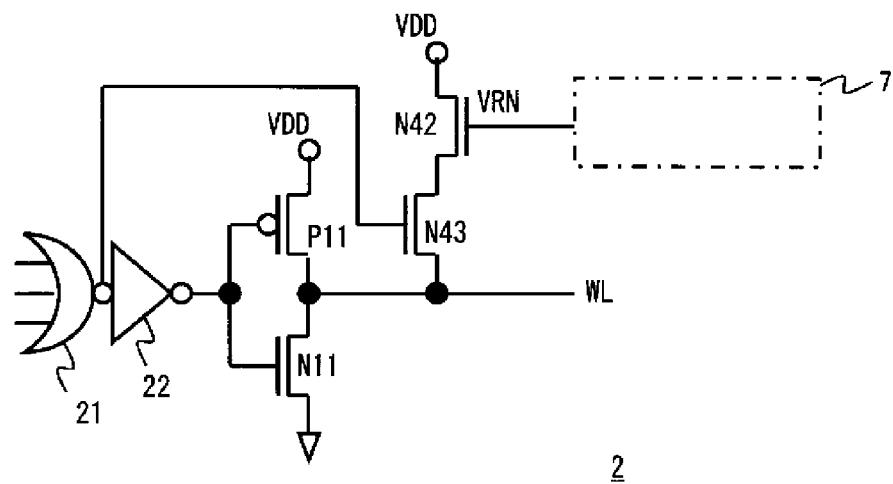
FIG. 13 shows a configuration example of a row selection circuit of a semiconductor storage device in accordance with a third exemplary embodiment of the present invention.

By forming the row selection circuit 2 from, for example, a circuit shown in FIG. 13, the selected word line WL can be first raised sharply to the threshold voltage: Vtna of the access transistor, and then the rising speed of the selected word line WL can be delayed after that. FIG. 13 shows a configuration example of the row selection circuit 2 used in a semiconductor storage device in accordance with this exemplary embodiment.

The circuit shown in FIG. 13 is formed by adding NMOSs (N42 and N43) and a VRN voltage generation circuit 7 to the circuit shown in FIG. 7. The gate of the NOMS (N43) is connected to the output of the NOR circuit 21. The drain of the NMOS (N43) is connected to the word line WL, and the source is connected to the drain of the NMOS (N42). A power-supply potential VDD is supplied to the source of the NMOS (N42), and the gate of the NMOS (N42) is connected to the VRN voltage generation circuit 7.

Figure 14:
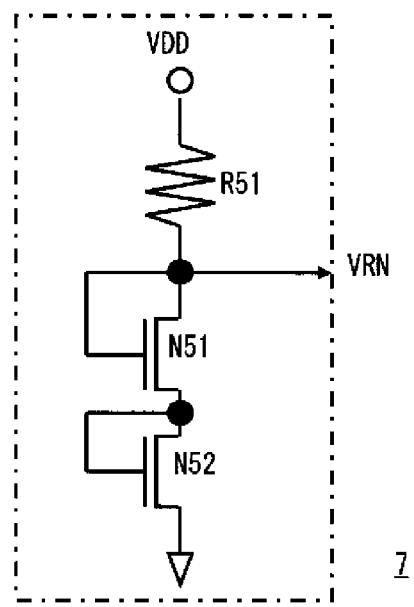
FIG. 14 shows another configuration example of a row selection circuit of a semiconductor storage device in accordance with a third exemplary embodiment of the present invention.

FIG. 14 shows an example of a configuration of a VRN voltage generation circuit 7. As shown in FIG. 14, the VRN voltage generation circuit 7 includes a resistor R51 and NMOSs (N51 and N52). A power-supply potential VDD is supplied to one end of the resistor 51. The other end of the resistor 51 is connected to the source of the NMOS (N51). The drain of the NMOS (N51) is connected to the source of the NMOS (N52).

The gate of the NMOS (N52) is connected to the connection point between the drain of the NMOS (N51) and the source of the NMOS (N52). The gate of the NMOS (N51) is connected to the connection point between the resistor 51 and the source of the NMOS (N51). A voltage VRN is output from the connection point between the resistor 51 and the source of the NMOS (N51).

In the example shown in FIG. 14, the sum of the threshold voltage of the NMOS (N52): Vtn52 and the threshold voltage of the NMOS (N51): Vtn51 is output as a voltage VRN. Note that by configuring such that the threshold voltage of the NMOS (N51): Vtn51 becomes equal to the threshold voltage of the NMOS (N42): Vtn42, a voltage equal to the threshold voltage of the NMOS (N52): Vtn52 is output to the source of the NMOS (N42).

In the case where the circuit shown in FIG. 13 is adopted as the row selection circuit 2, when a High level is applied to the gate of the NMOS (N43), the NMOS (N43) is turned on and the potential of Vtn52 can be thereby applied to the word line WL.

Note that by forming the NMOS (N52) from a transistor having the same threshold voltage as that of the access transistors MCN2 and MCN3 of the memory cell MC, the potential of Vtna can be applied to the word line WL. In this manner, after the word line WL is raised sharply to Vtna, the word line WL can be driven to VDD while delaying its rising speed by using the PMOS (P11) having a small driving capability as described above.

Fourth Exemplary Embodiment

Figure 15:
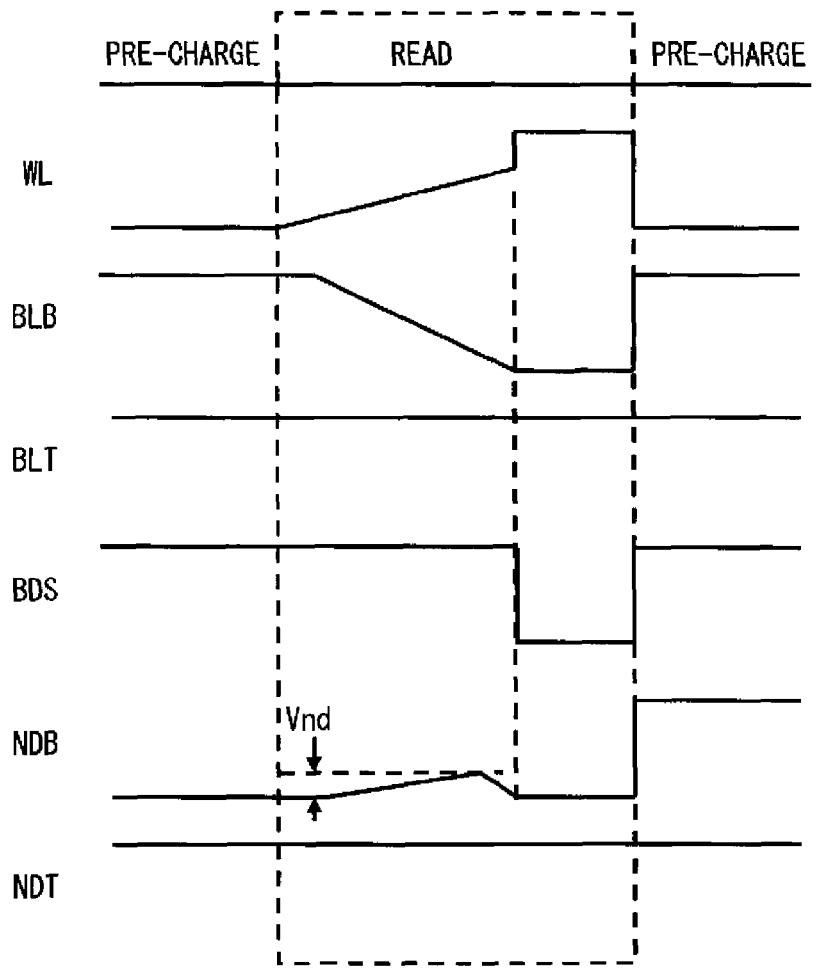
FIG. 15 is a timing chart for explaining an operation of a semiconductor storage device in accordance with a forth exemplary embodiment of the present invention.

Another exemplary embodiment will be described hereinafter. An operation of a semiconductor storage device in accordance with a fourth exemplary embodiment of the present invention is explained hereinafter with reference to FIG. 15. FIG. 15 is a timing chart for explaining an operation of a semiconductor storage device in accordance with this exemplary embodiment. In this exemplary embodiment, as shown in FIG. 15, a delay is added to the rising speed of the selected word line, and after the discharging of the bit line has been completed, the word line is raised sharply and roughly vertically to VDD.

As long as the discharging of the bit line BL has been completed, even if the word line WL is raised sharply, it does not lead to a malfunction. In accordance with this exemplary embodiment, after the discharging of the bit line has been completed, the word line WL is pulled up sharply to VDD so that the read period can be shortened. In addition, since the period in which the level of the word line WL is at VDD and the margin of a write operation is thereby larger can be shifted forward, a faster SRAM operation becomes possible.

Figure 16:
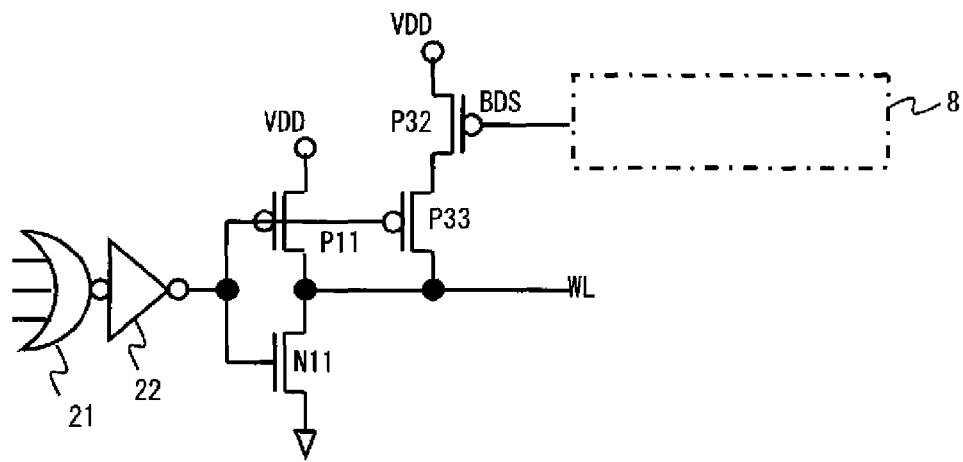
FIG. 16 shows a configuration example of a row selection circuit of a semiconductor storage device in accordance with a fourth exemplary embodiment of the present invention.

By constructing the row selection circuit 2 from, for example, a circuit shown in FIG. 16, the word line WL can be raised sharply to VDD after the discharging of the bit line BL has been completed. FIG. 16 shows a configuration example of the row selection circuit 2 used in a semiconductor storage device in accordance with this exemplary embodiment.

The circuit shown in FIG. 16 is formed by adding a bit-line discharge signal generation circuit 8 to the circuit shown in FIG. 10. The gate of the PMOS (P32) is connected to the bit-line discharge signal generation circuit 8. The bit-line discharge signal generation circuit 8 generates a bit-line discharge signal BDS that is used to raise the word line WL roughly vertically to a set potential VDD after the bit line BL is discharged. For example, a bit-line discharge signal BDS that becomes a Low level after the discharging of the bit line has been completed is output.

Figure 17:
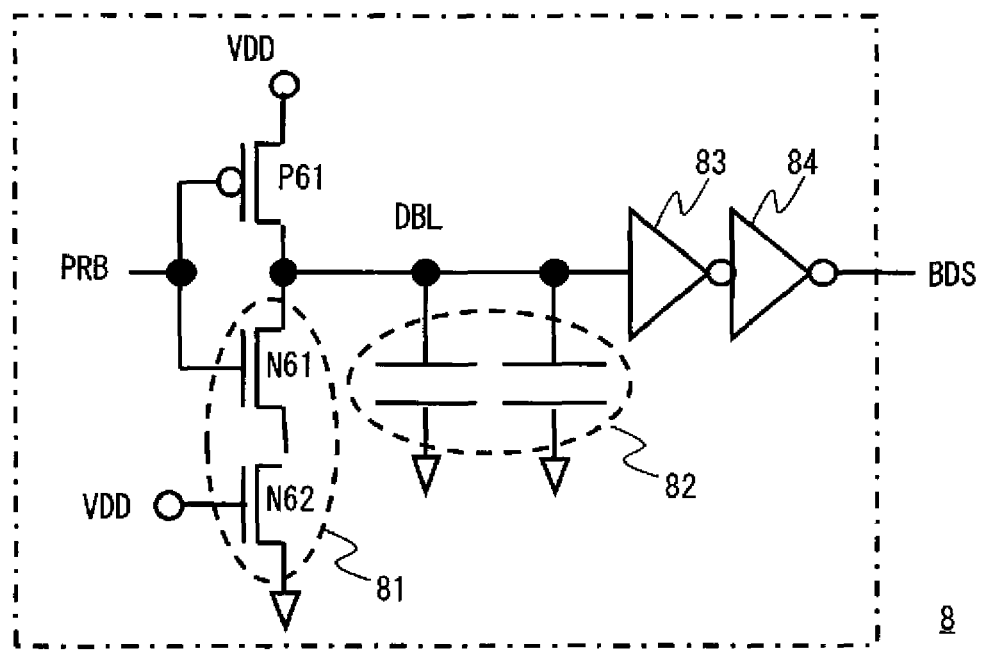
FIG. 17 shows a configuration example of a bit-line discharge signal generation circuit of a semiconductor storage device in accordance with a fourth exemplary embodiment of the present invention.
Figure 18:
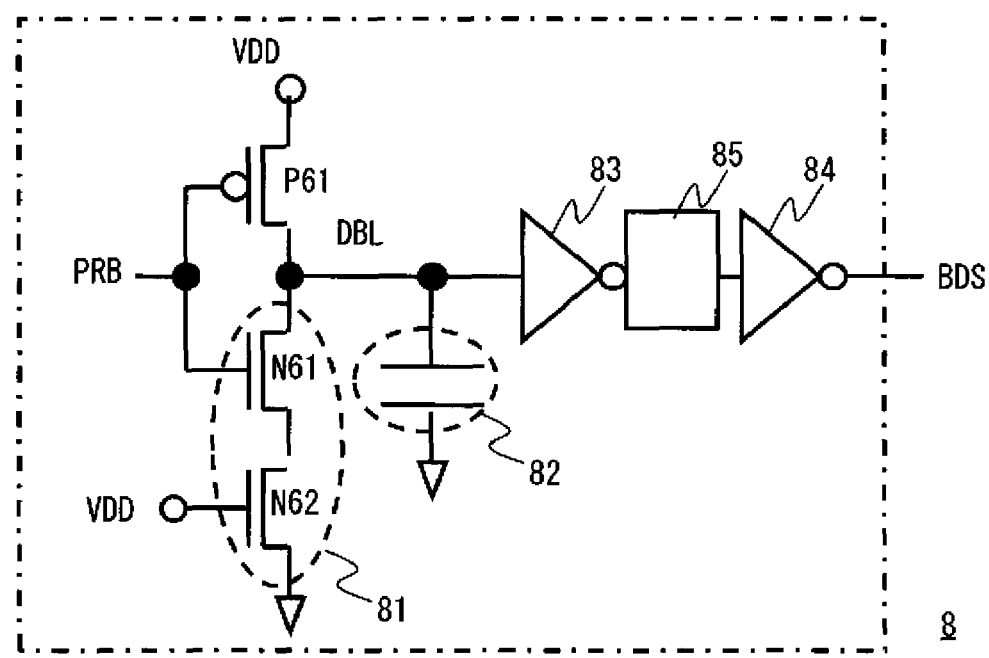
FIG. 18 shows another configuration example of a bit-line discharge signal generation circuit of a semiconductor storage device in accordance with a fourth exemplary embodiment of the present invention.

FIGS. 17 and 18 show configuration examples of a bit-line discharge signal generation circuit 8. The circuit shown in FIG. 17 includes a PMOS (P61), NMOSs (N61 and N62) constituting a dummy cell 81, a dummy capacitance 82, and inverters 83 and 84. Transistors having a similar structure to that of the access transistor and the driver transistor of the memory cell MC are used for the NMOSs (N61 and N62) constituting the dummy cell 81.

The PMOS (P61) and the NMOS (N61) constitute an inverter. A power-supply potential VDD is supplied to the source of the PMOS (P61). The drain of the NMOS (N61) is connected to the source of the NMOS (N62). The gates of the NMOS (N61) and PMOS (P61) are connected together, and a PRB signal is input to these gates. A power-supply potential VDD is supplied to the gate of the NMOS (N62). A dummy bit line DBL is connected to the connection point between the PMOS (P61) and the NMOS (N61). Two inverters 83 and 84 are also connected to the dummy bit line DBL.

A dummy capacitance 82 is disposed between the connection point of the PMOS (P61) and the NMOS (N61), and the inverter 83. Further, one end of the dummy capacitance 82 is connected to the dummy bit line DBL. The capacitance value of the dummy capacitance 82 is set to a larger value than that of the bit line BL. In this exemplary embodiment, two dummy cells are provided. With the structure like this, it is possible to generate a bit-line discharge signal that is delayed by an amount equivalent to the time necessary to discharge the bit line.

The circuit shown in FIG. 18 is formed by adding a delay circuit 85 between the inverters 83 and 84 in the circuit shown in FIG. 17. Note that FIG. 18 shows an example where one capacitor is provided as the dummy capacitance 82.

In this bit-line discharge signal generation circuit 8, the potential of the dummy bit line DBL is detected by the inverter composed of the PMOS (P61) and NMOS (N61), and after the discharging of the bit line BL has been completed (the bit line BL becomes 0 V), it is inverted at earlier timing. In this exemplary embodiment, the bit-line discharge signal can be generated, by the delay circuit 85, after the bit line BL is discharged.

Figure 19:
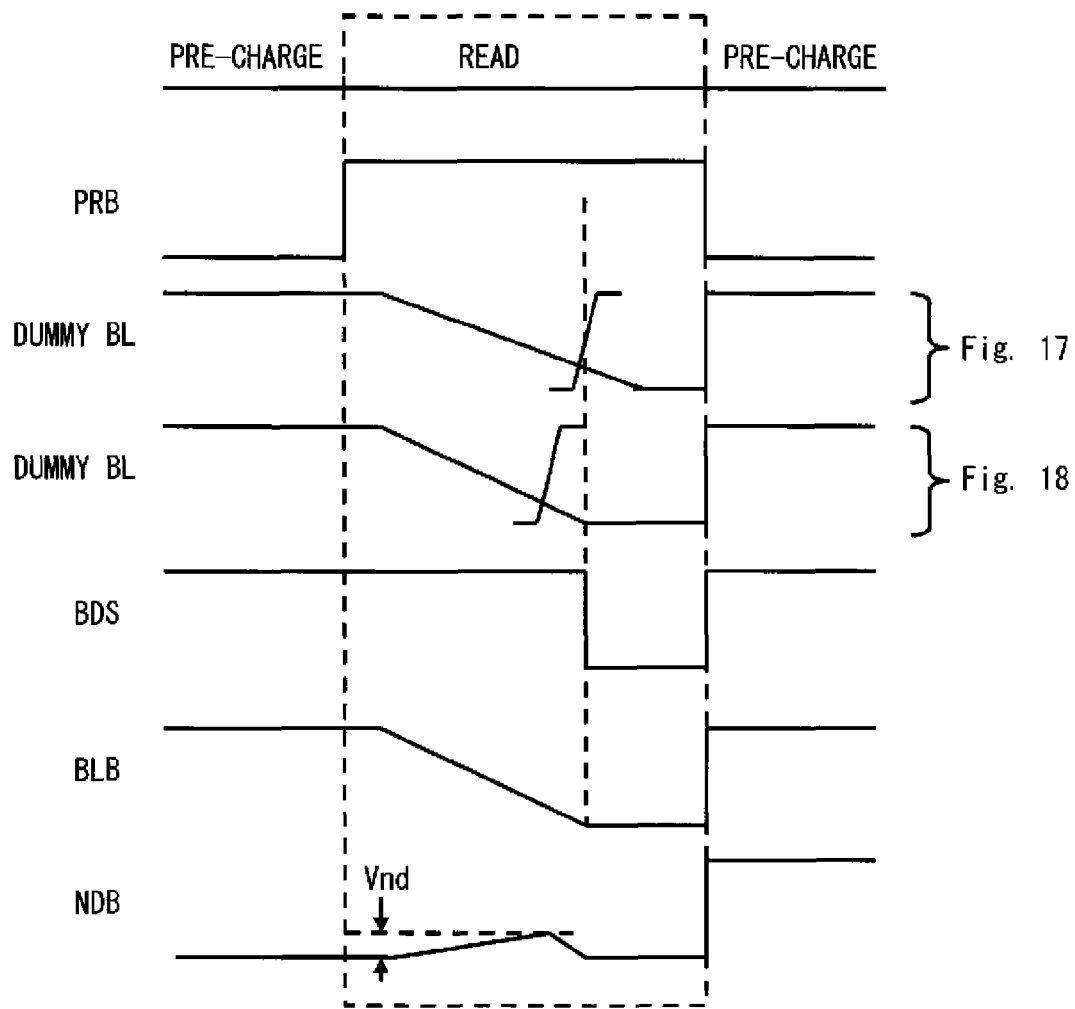
FIG. 19 is a timing chart for explaining an operation of a semiconductor storage device in accordance with a forth exemplary embodiment of the present invention.

FIG. 19 shows a timing chart for explaining an operation of a semiconductor storage device in the case where a bit-line discharge signal generation circuit shown in FIG. 17 or 18 is adopted. FIG. 19 collectively shows the potential change of the dummy bit line DBL of the bit-line discharge signal generation circuit 8 shown in FIG. 17 and the potential change of the dummy bit line DBL of the bit-line discharge signal generation circuit 8 shown in FIG. 18.

As shown in FIG. 19, regardless of which of the bit-line discharge signal generation circuits 8 shown in FIGS. 17 and 18 is used, the potential of a dummy bit line DBL falls when a PRB signal becomes a High level. After that, when the bit line BL is discharged, a bit-line discharge signal BDS changes from a High level to a Low level. In response to this, the word line WL can be raised roughly vertically as shown in FIG. 15.

Fifth Exemplary Embodiment

Figure 20:
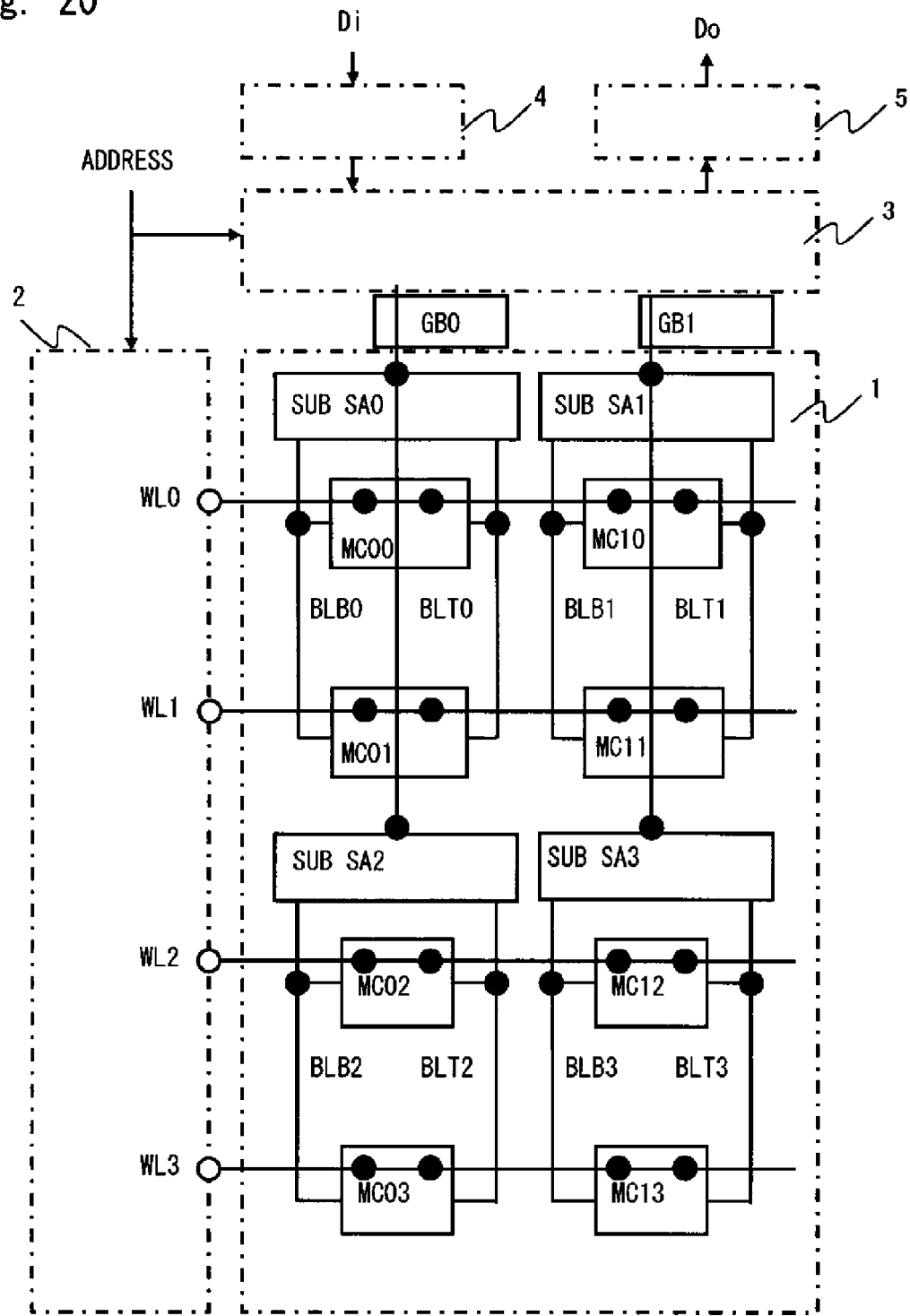
FIG. 20 shows a configuration of a semiconductor storage device in accordance with a seventh exemplary embodiment of the present invention.
Figure 21:
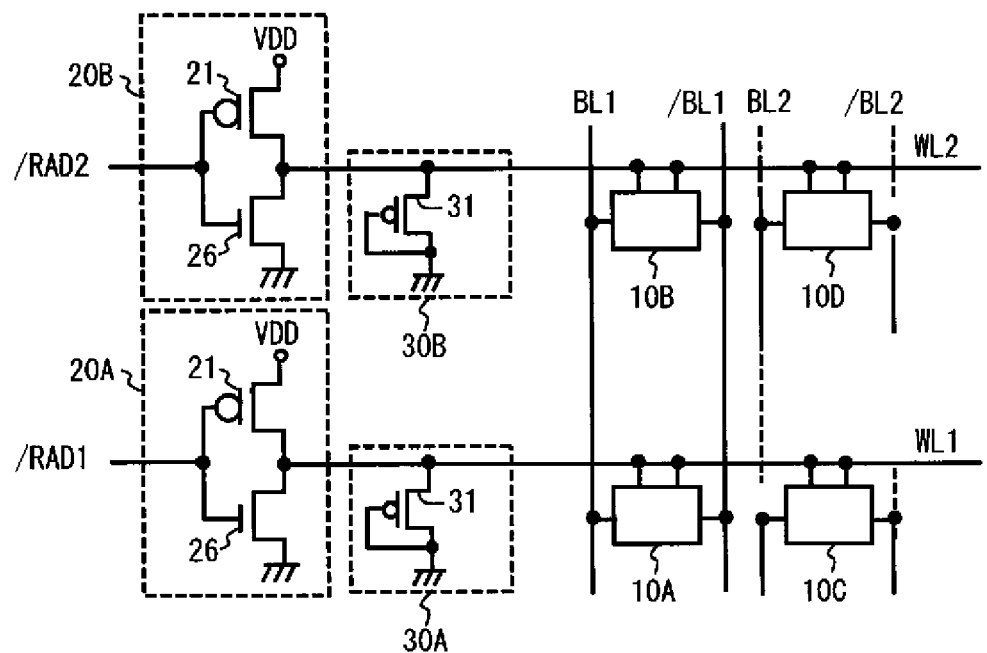
FIG. 21 shows a configuration of a semiconductor storage device disclosed in Yamagami.
Figure 22:
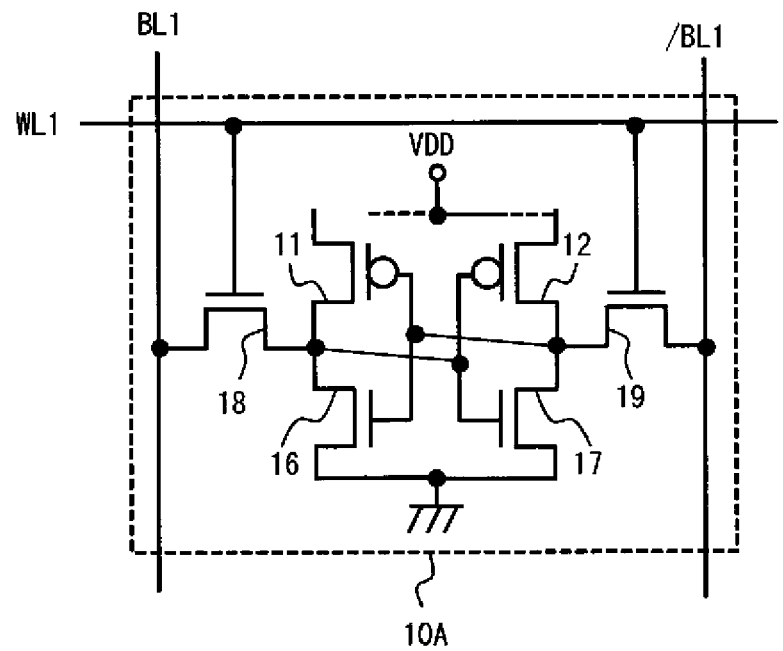
FIG. 22 shows a memory cell of a semiconductor storage device shown in FIG. 22.
Figure 23:
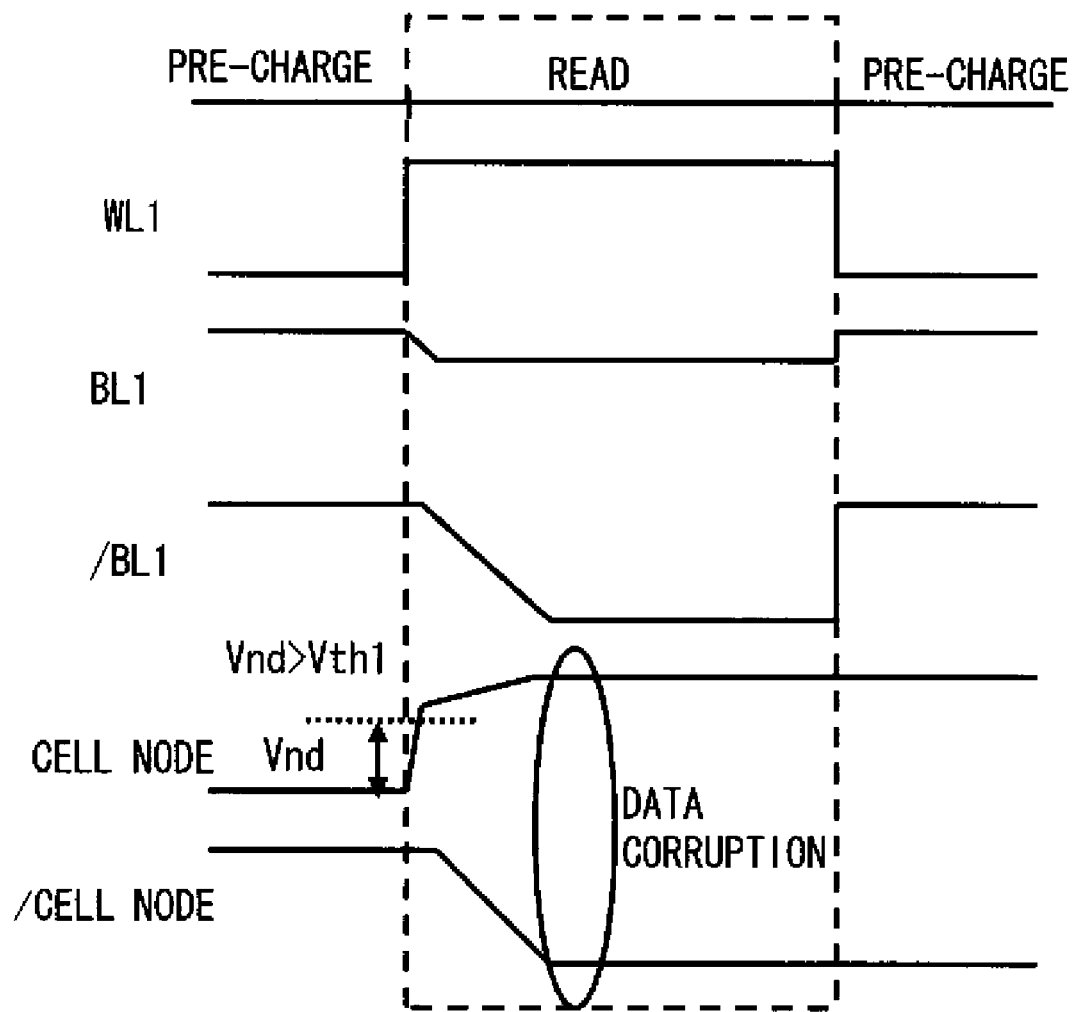
FIG. 23 is a diagram for explaining a problem of a semiconductor storage device shown in FIG. 22.

Another exemplary embodiment will be described hereinafter. A configuration of a semiconductor storage device in accordance with a fifth exemplary embodiment of the present invention is explained hereinafter with reference to FIG. 20. FIG. 20 shows a configuration of a semiconductor storage device in accordance with this exemplary embodiment. As shown in FIG. 20, a semiconductor storage device in accordance with this exemplary embodiment includes a memory cell array 1, a row selection circuit 2, a column selection circuit 3, a writing circuit 4, and a reading circuit 5.

In this exemplary embodiment, the memory cell array 1 includes sub sense amplifiers (sub SA0, sub SA1, sub SA2, and sub SA3). Bit-line pairs (BLB0 and BLT0, BLB1 and BLT1, BLB2 and BLT2, and BLB3 and BLT3) are connected to the respective sub sense amplifiers (sub SA0, sub SA1, sub SA2, and sub SA3). That is, the bit-line pairs are divided for each of the sub sense amplifiers. In this way, the delay in the discharging of the bit line can be reduced.

In the semiconductor storage device 10 including a memory array 1 capable of reducing the discharge delay of the bit line like this, by using the previously-described circuit capable of controlling the rising speed of the selected word line WL by adding a delay (e.g., FIGS. 7, 8, 10 and 11) as a row selection circuit 2, the operation of the semiconductor storage device can be made faster without compromising the SNM improvement effect.

As shown in FIG. 6, by adding a delay, which is at least three times of the discharge delay of the bit line exhibited when no WL delay is set and the word line WL is thereby raised roughly vertically, to the rising of the selected word line WL, a significant improvement effect against the SNM failure can be achieved. However, in accordance with this exemplary embodiment, by making the bit-line discharge delay smaller, a similar improvement effect against the SNM failure can be achieved even when the delay of the rising speed of the selected word line WL is made smaller.

Since an improvement can be made against the SNM failure without deteriorating the writing characteristic, both an excellent reading operation and writing operation of the SRAM can be achieved. Therefore, it is possible to provide an SRAM that operates with stability. Further, without compromising the above-mentioned advantageous effect, improvements of the SRAM quality by an SNM test and speed-up of the SRAM can be also realized.

As has been explained so far, in accordance with this exemplary embodiment of the present invention, by adding a delay to the rising speed of the selected word line WL, the rise of the Low level retained by the cell node of the memory cell can be reduced. Therefore, both excellent reading/writing operations can be achieved.

Note that the present invention is not limited to the above-described exemplary embodiments, and various modifications can be made as appropriate without departing from the spirit and scope of the present invention.

The first to fifth exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor storage device comprising:
   a plurality of memory cells arranged in a matrix pattern;
   a plurality of word lines provided to correspond to the respective rows of the memory cells;
   a plurality of bit lines connected to a plurality of memory cells in respective columns of the memory cells; and
   a row selection circuit that, in a read operation, drives the word line to a set potential at a drive speed slower than a discharge speed of the bit line exhibited when the word line is raised roughly vertically to the set potential.

2. The semiconductor storage device according to claim 1, wherein the word line is driven such that an amount of voltage change of data retained in the memory cell exhibited when the word line is driven at the drive speed becomes smaller than an amount of voltage change of data retained in the memory cell exhibited when the word line is raised roughly vertically.

3. The semiconductor storage device according to claim 1, wherein the row selection circuit comprises:
   a PMOS transistor and an NMOS transistor constituting an inverter,
   wherein a driving capability of the PMOS transistor is smaller than a driving capability of the NMOS transistor.

4. The semiconductor storage device according to claim 1, wherein the row selection circuit comprises:
   a PMOS transistor and an NMOS transistor constituting an inverter,
   a PMOS transistor for adjusting drive speed connected to a source of the PMOS transistor; and a voltage generation circuit connected to a gate of the PMOS transistor for adjusting drive speed.

5. The semiconductor storage device according to claim 1, wherein the row selection circuit drives the word line to the set potential at a speed slower than the discharge speed and faster than the drive speed according to an input test signal.

6. The semiconductor storage device according to claim 1, wherein the memory cell comprises an access transistor, a gate of the access transistor being connected to the word line, and a source of the access transistor being connected to the bit line, and the row selection circuit, in a read operation, first raises the word line roughly vertically to a threshold voltage of the access transistor, and then drives to the set potential.

7. The semiconductor storage device according to claim 1, wherein the row selection circuit further comprises a bit-line discharge signal generation circuit that generates a bit-line discharge signal, and the word line is raised roughly vertically to the set potential after the bit line is discharged according to the bit-line discharge signal.

8. The semiconductor storage device according to claim 1, wherein the plurality of memory cells are divided into a plurality of memory-cell blocks, and the bit line is provided for each of the plurality of memory-cell blocks.

* * * * *